US009922852B2

United States Patent
Sakugawa et al.

(10) Patent No.: US 9,922,852 B2
(45) Date of Patent: Mar. 20, 2018

(54) PRESSURE CALIBRATION JIG AND SUBSTRATE PROCESSING APPARATUS

(71) Applicant: EBARA CORPORATION, Tokyo (JP)

(72) Inventors: Suguru Sakugawa, Tokyo (JP); Nobuyuki Takahashi, Tokyo (JP); Toru Maruyama, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 15/311,638

(22) PCT Filed: Apr. 6, 2015

(86) PCT No.: PCT/JP2015/060730
§ 371 (c)(1),
(2) Date: Nov. 16, 2016

(87) PCT Pub. No.: WO2015/178110
PCT Pub. Date: Nov. 26, 2015

(65) Prior Publication Data
US 2017/0092519 A1    Mar. 30, 2017

(30) Foreign Application Priority Data

May 23, 2014  (JP) ................................ 2014-106862

(51) Int. Cl.
*B24B 37/005*    (2012.01)
*B24B 49/08*    (2006.01)
(Continued)

(52) U.S. Cl.
CPC ...... *H01L 21/67253* (2013.01); *B24B 37/005* (2013.01); *B24B 37/30* (2013.01);
(Continued)

(58) Field of Classification Search
CPC ..... B24B 37/005; B24B 37/30; B24B 37/304; B24B 49/08; B24B 49/16; H01L 21/304
(Continued)

(56) References Cited

U.S. PATENT DOCUMENTS

| 2005/0054266 A1* | 3/2005 | Togawa | B24B 37/30 |
| | | | 451/5 |
| 2005/0070205 A1* | 3/2005 | Korovin | B24B 37/30 |
| | | | 451/5 |

(Continued)

FOREIGN PATENT DOCUMENTS

| JP | 2002-134446 A | 5/2002 |
| JP | 2005-081507 A | 3/2005 |

(Continued)

OTHER PUBLICATIONS

International Search Report issued in Patent Application No. PCT/JP2015/060730 dated Jun. 16, 2015.

*Primary Examiner* — Eileen Morgan
(74) *Attorney, Agent, or Firm* — Pearne & Gordon LLP

(57) ABSTRACT

The invention simplifies airbag calibration. A pressure calibration jig calibrates pressure to be applied to a plurality of airbags disposed inside a top ring for holding and pressing a wafer against a polishing pad. The pressure calibration jig includes a plurality of first passages capable of communicating with the plurality of airbags, respectively; a second passage which combines and connects the plurality of first passages to a pressure calibration sensor; and a flow control portion configured to allow a fluid to flow through the first passage of the plurality of first passages, which first passage corresponds to an airbag selected for pressure calibration, in a direction from the selected airbag toward the second passage, and also configured to prevent the fluid from flowing through the first passages other than the first passage (Continued)

corresponding to the selected airbag in a direction from the second passage toward the airbags.

20 Claims, 8 Drawing Sheets

(51) Int. Cl.
| | |
|---|---|
| *B24B 49/16* | (2006.01) |
| *H01L 21/304* | (2006.01) |
| *H01L 21/67* | (2006.01) |
| *B24B 37/30* | (2012.01) |
| *H01L 21/306* | (2006.01) |
| *H01L 21/677* | (2006.01) |
| *H01L 21/683* | (2006.01) |
| *H01L 21/687* | (2006.01) |

(52) U.S. Cl.
CPC .............. *B24B 49/08* (2013.01); *B24B 49/16* (2013.01); *H01L 21/304* (2013.01); *H01L 21/30625* (2013.01); *H01L 21/67051* (2013.01); *H01L 21/67092* (2013.01); *H01L 21/67219* (2013.01); *H01L 21/67778* (2013.01); *H01L 21/6838* (2013.01); *H01L 21/68707* (2013.01); *H01L 21/68764* (2013.01)

(58) Field of Classification Search
USPC .................................. 451/5, 10, 11, 41, 288
See application file for complete search history.

(56) References Cited

U.S. PATENT DOCUMENTS

| | | | |
|---|---|---|---|
| 2006/0205322 A1 | 9/2006 | Kalenian et al. | |
| 2008/0270046 A1* | 10/2008 | Borenstein | G01D 3/024 702/50 |
| 2010/0311309 A1* | 12/2010 | Shinozaki | B24B 49/08 451/5 |
| 2014/0065732 A1* | 3/2014 | Okada | G05B 19/41865 438/8 |

FOREIGN PATENT DOCUMENTS

| | | |
|---|---|---|
| JP | 2008-529308 A | 7/2008 |
| JP | 2011-143537 A | 7/2011 |

* cited by examiner

PRESSURE CALIBRATION JIG AND SUBSTRATE PROCESSING APPARATUS

TECHNICAL FIELD

The invention relates to a pressure calibration jig and a substrate processing apparatus.

BACKGROUND ART

Substrate processing apparatuses have been used in recent years to perform various kinds of processing on substrates such as semiconductor wafers. One example of substrate processing apparatuses is a CMP (Chemical Mechanical Polishing) apparatus for polishing substrates.

The CMP apparatus includes a polishing unit for polishing substrates, a cleaning unit for cleaning and drying the substrates, a loading/unloading unit that delivers the substrates to the polishing unit and receives the substrates cleaned and dried by the cleaning unit, etc. The CMP apparatus further includes a transfer unit that transfers the substrates among the polishing, cleaning, and loading/unloading units. The CMP apparatus transfers the substrates by means of the transfer unit, and serially performs the various kinds of processing, including polishing, cleaning, and drying.

The polishing unit includes a polishing table to which a polishing pad for polishing a substrate is attached, and a holding portion for holding and pressing the substrate against the polishing pad. Inside the holding portion, there are provided a plurality of airbags for holding the substrate while sucking the substrate onto the holding portion and pressing the substrate against the polishing pad. The use of the airbags enables the entire substrate to be applied with uniform pressure, thereby achieving a uniform and stable polishing characteristic. To that end, the pressure applied to the airbags is previously calibrated (corrected) to have a predetermined value with accuracy.

According to conventional calibration methods, an airbag conduit located near an airbag membrane is pulled out and connected to a pressure gauge. In accordance with a value measured at the pressure gauge, a D/A parameter for calibration is calibrated. Specifically, with respect to an initial parameter, measured values obtained when a plurality of specified pressures are applied are recorded. A post-calibration parameter is then calculated from the measured values by using a calculation formula, and reflected in the apparatus. After the post-calibration parameter is reflected, measured values of pressure are checked again. If the measured values are out of a required accuracy range, the post-calibration parameter is recalculated and reflected in the apparatus. The above-described process is repeated until the specified accuracy is satisfied. The process is performed on a single airbag and therefore needs to be carried out with respect to each polishing table and airbag of the apparatus. Further, the calibration includes two operations, namely, an operation including operating the apparatus and changing the parameter, and an operation including measurement of pressure and calculation. In this light, the calibration is carried out preferably by two persons for efficiency's sake.

CITATION LIST

Patent Document

Patent Document 1: JP-A-2011-143537

SUMMARY OF INVENTION

Technical Problem

Conventional art is not designed in consideration of simplifying the airbag calibration.

In other words, conventional calibration methods do not intend to partially automate and simplify various operations included in calibration to reduce the time required to carry out these operations. Conventional methods require repeating the operation of connecting a plurality of airbags mounted on each polishing table to a pressure gauge on an airbag area basis and then performing calibration. It is also required to calculate parameters outside the apparatus and manually reflect the calculated values in the apparatus. The conventional calibration methods thus require much time and effort to perform calibration.

In view of the foregoing, the present invention has an object of simplification of airbag calibration.

Solution to Problem

One embodiment of a pressure calibration jig of the invention has been made in light of the problem noted above. The embodiment provides a pressure calibration jig used for calibrating pressure applied to a plurality of airbags disposed inside a holding portion configured to hold and press a substrate against a polishing tool. The pressure calibration jig comprises: a plurality of first passages capable of being communicated with the plurality of airbags, respectively; a second passage configured to combine and connect the plurality of first passages to a pressure sensor for pressure calibration; and a flow control portion configured to allow a fluid to flow through the first passage of the plurality of first passages, which first passage corresponds to an airbag selected for pressure calibration, in a direction from the selected airbag toward the second passage, and also configured to prevent the fluid from flowing through the first passages other than the first passage corresponding to the selected airbag in a direction from the second passage toward the airbags.

According to one embodiment of the pressure calibration jig, the flow control portion may include a plurality of first on-off valves respectively disposed in the plurality of first passages and configured to open/close the plurality of first passages. The plurality of first on-off valves may be configured to operate in synchronization with second on-off valves, the second on-off valves being respectively disposed in a plurality of main passages which connect a pressure regulator provided inside a substrate processing apparatus comprising the holding portion to the plurality of airbags. The plurality of first passages may be connected to the main passages between the second on-off valves and the airbags.

According to one embodiment of the pressure calibration jig, the flow control portion may include a plurality of first on-off valves respectively disposed in the plurality of first passages and configured to open/close the plurality of first passages. The plurality of first on-off valves may be configured to operate in synchronization with third on-off valves, the third on-off valves being disposed in a plurality of bypass passages which bypass second on-off valves, the second on-off valves being respectively disposed in a plurality of main passages which connect a pressure regulator provided inside a substrate processing apparatus comprising the holding portion to the plurality of airbags. The plurality of first passages may be connected to the main passages between the second on-off valves and the airbags.

According to one embodiment of the pressure calibration jig, the flow control portion may include a plurality of first on-off valves respectively disposed in the plurality of first passages and configured to open/close the plurality of first passages. The plurality of first on-off valves may be configured to operate in synchronization with fourth on-off valves, the fourth on-off valves being respectively disposed in a plurality of suction passages which diverge from the airbag side of second on-off valves, the second on-off valves being respectively disposed in the plurality of main passages which connect a pressure regulator provided inside a substrate processing apparatus comprising the holding portion to the plurality of airbags. The plurality of first passages may be connected to the main passages between the second on-off valves and the pressure regulator.

According to one embodiment of the pressure calibration jig, the flow control portion may include a plurality of check valves respectively disposed in the plurality of first passages and configured to allow a fluid to flow only in a direction from the airbags toward the second passage.

According to one embodiment of the pressure calibration jig, the pressure calibration jig may further comprise a multi-connector enabling fluid conduction through the plurality of first passages. The pressure calibration jig may be connected through the multi-connector to a substrate processing apparatus comprising the holding portion.

A substrate processing apparatus of the present invention according to one embodiment comprises a polishing table to which a polishing pad used for polishing a substrate is attached; a holding portion configured to hold and press the substrate against the polishing pad; a plurality of airbags disposed inside the holding portion; and any one of the above-mentioned pressure calibration jigs used for calibrating pressure applied to the plurality of airbags.

Advantageous Effects of Invention

According to the present invention arranged as described above, the airbag calibration can be simplified.

DESCRIPTION OF EMBODIMENTS

A pressure calibration jig and a substrate processing apparatus according to one embodiment of the present invention will be explained below with reference to the accompanying drawings. In the following explanation, a CMP apparatus will be taken as an example of the substrate processing apparatus, but this does not limit the present invention. Further, in the following explanation, the substrate processing apparatus including a loading/unloading unit 2, a polishing unit 3, and a cleaning unit 4 will be explained. This, however, does not limit the present invention.

The structure of the CMP apparatus will be first explained, and thereafter pressure calibration on airbags will be explained.

<Substrate Processing Apparatus>

Figure 1:
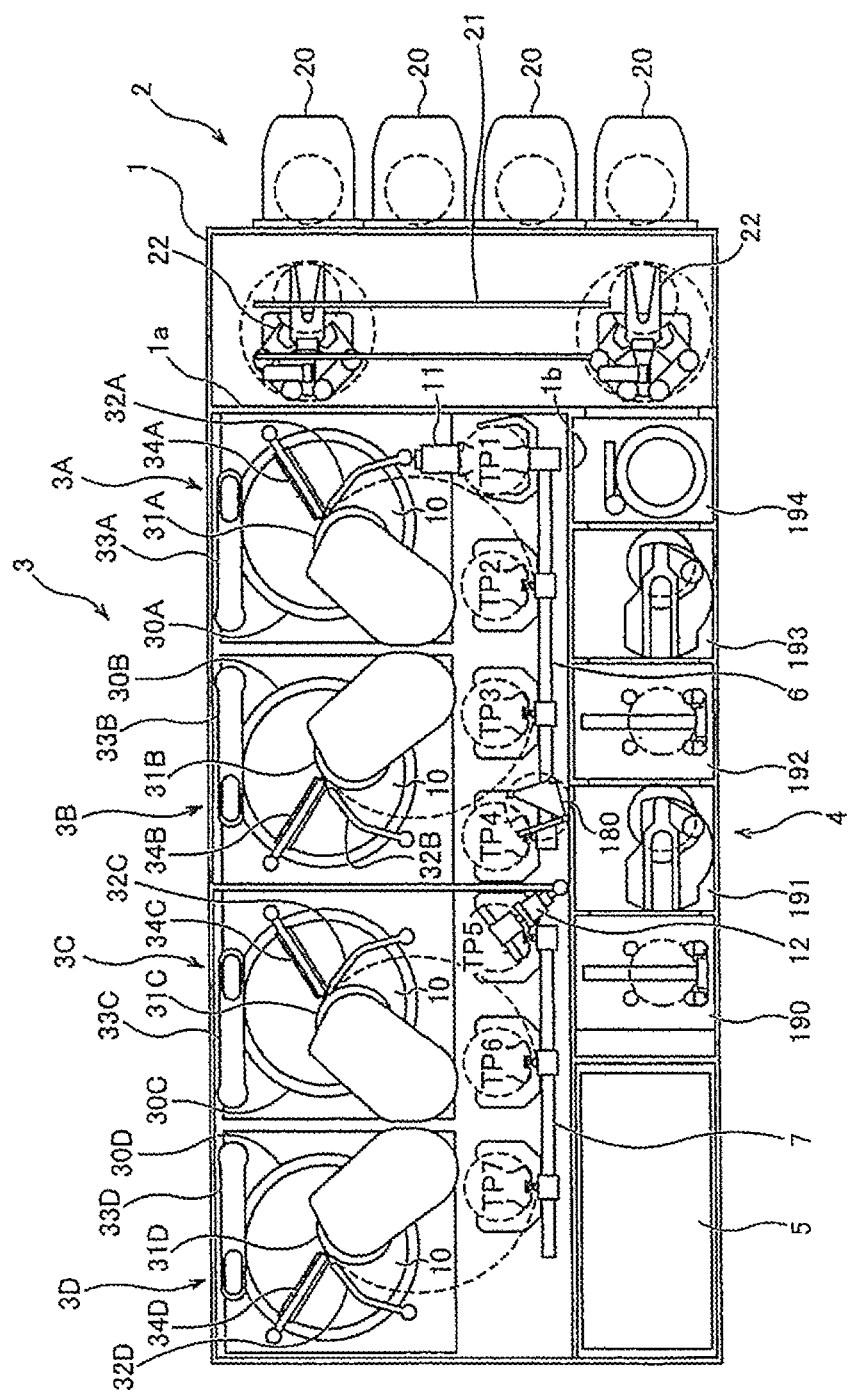
FIG. 1 is a plan view of an entire arrangement of a substrate processing apparatus according to the present embodiment.

FIG. 1 is a plan view of an entire arrangement of a substrate processing apparatus according to one embodiment of the invention. As illustrated in FIG. 1, the CMP apparatus has a housing 1 in a substantially rectangular shape. An inside of the housing 1 is partitioned by partition walls 1a and 1b into the loading/unloading unit 2, the polishing unit 3, and the cleaning unit 4. The loading/unloading unit 2, the polishing unit 3, and the cleaning unit 4 are assembled and ventilated independently of each other. The cleaning unit 4 is provided with a controller 5 which controls a substrate processing operation.

<Loading/Unloading Unit>

The loading/unloading unit 2 has two or more (four in the present embodiment) front loading portions 20 in each of which a wafer cassette containing a number of wafers (substrates) is loaded. The front loading portions 20 are situated adjacent to the housing 1 and arranged along a width direction (a direction perpendicular to a longitudinal direction) of the substrate processing apparatus. An open cassette, an SMIF (Standard Manufacturing Interface) pod or an FOUP (Front Opening Unified Pod) can be loaded in each of the front loading portions 20. The SMIF or the FOUP is a hermetically sealed container which contains a wafer cassette and covers it with partition walls to thereby provide an interior environment isolated from an external space.

A traveling mechanism 21 is provided in the loading/unloading unit 2 along a line of the front loading portions 20. Two transfer robots (each including a loader and a transfer mechanism) 22 are provided on the travel mechanism 21. The transfer robots are movable along a direction in which the wafer cassettes are arranged. The transfer robots 22 are capable of accessing the wafer cassettes loaded in the front loading portions 20 by moving along the traveling mechanism 21. The transfer robots 22 each have an upper hand and a lower hand. The upper hand is used to return a processed wafer to the wafer cassette, and the lower hand is used to take out a wafer from the wafer cassette before processing. The transfer robots 22 are thus capable of using the two hands differently. The lower hands of the transfer robots 22 are each capable of inverting the wafer by rotating around an axis thereof.

The loading/unloading unit 2 is a section which needs to be maintained in the cleanest condition. An inside of the loading/unloading unit 2 is therefore constantly maintained at a higher pressure as compared to the outside of the CMP apparatus, the polishing unit 3, and the cleaning unit 4. The polishing unit 3, in which slurry is used as a polishing liquid, is the dirtiest region. Therefore, an inside of the polishing unit 3 is placed under negative pressure and maintained at a pressure lower than the pressure inside the cleaning unit 4. The loading/unloading unit 2 is provided with a filter fan unit (not shown) having a clean air filter, such as a HEPA filter, a ULPA filter, or a chemical filter. The filter fan unit continuously blows out clean air which is free of particles, toxic vapor, and toxic gas.

<Polishing Unit>

The polishing unit 3 is a region in which the polishing (planarization) of wafers is performed. The polishing unit 3 includes a first polishing unit 3A, a second polishing unit 3B, a third polishing unit 3C, and a fourth polishing unit 3D. As illustrated in FIG. 1, the first polishing unit 3A, the second polishing unit 3B, the third polishing unit 3C, and the fourth polishing unit 3D are arranged in the longitudinal direction of the substrate processing apparatus.

As illustrated in FIG. 1, the first polishing unit 3A has a polishing table 30A to which a polishing pad 10 with a polishing surface is attached; a top ring 31A for polishing the wafer while holding and pressing the wafer against the polishing pad 10 on the polishing table 30A; a polishing liquid supply nozzle 32A for supplying a polishing liquid or a dressing liquid (deionized water, for example) to the polishing pad 10; a dresser 33A for dressing the polishing surface of the polishing pad 10; and an atomizer 34A for atomizing and spraying a mixed fluid of a liquid (such as deionized water) and a gas (such as nitrogen gas), or a liquid (such as deionized water), onto the polishing surface. Inside the top ring 31A, there are a plurality of airbags for the purpose of holding the wafer while sucking the wafer onto the top ring 31A and pressing the wafer against the polishing pad 10.

Likewise, the second polishing unit 3B has a polishing table 30B to which the polishing pad 10 is attached, a top ring 31B, a polishing liquid supply nozzle 32B, a dresser 33B, and an atomizer 34B. The third polishing unit 3C has a polishing table 30C to which the polishing pad 10 is attached, a top ring 31C, a polishing liquid supply nozzle 32C, a dresser 33C, and an atomizer 34C. The fourth polishing unit 3D has a polishing table 30D to which the polishing pad 10 is attached, a top ring 31D, a polishing liquid supply nozzle 32D, a dresser 33D, and an atomizer 34D. A plurality of airbags are disposed inside each of the top rings 31B, 31C, and 31D to hold the wafer while sucking the wafer onto the top ring 31B, 31C, or 31D and press the wafer against the polishing pad 10.

The first polishing unit 3A, the second polishing unit 3B, the third polishing unit 3C, and the fourth polishing unit 3D have the same structure. Therefore, in the following description only the first polishing unit 3A will be explained.

Figure 2:
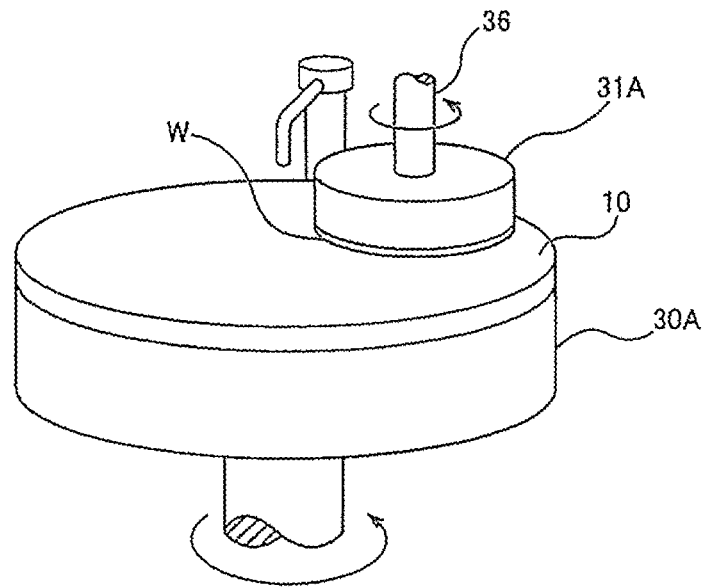
FIG. 2 is a schematic perspective view of a polishing unit.

FIG. 2 is a schematic perspective view of the first polishing unit 3A. The top ring 31A is supported by a top ring shaft 36. The polishing pad 10 is applied to an upper surface of the polishing table 30A. An upper surface of the polishing pad 10 provides a polishing surface for polishing a wafer W. Instead of the polishing pad 10, fixed abrasive grains may be used. The top ring 31A and the polishing table 30A are configured to rotate around respective axes thereof as shown by arrows. The wafer W is held on a lower surface of the top ring 31A by vacuum suction. During polishing, a polishing liquid is supplied from the polishing liquid supply nozzle 32A to the polishing surface of the polishing pad 10, and the wafer W to be polished is polished while being pressed by the top ring 31A against the polishing surface.

A transfer mechanism for transferring a wafer will be explained below. As illustrated in FIG. 1, a first linear transporter 6 is disposed adjacent to the first and second polishing units 3A and 3B. The first linear transporter 6 is a mechanism which transfers a wafer among four transfer positions (a first transfer position TP1, a second transfer position TP2, a third transfer position TP3, and a fourth transfer position TP4 arranged in this order from the loading/unloading unit) located along a direction in which the polishing units 3A and 3B are arranged.

A second linear transporter 7 is disposed adjacent to the third and fourth polishing units 3C and 3D. The second linear transporter 7 is a mechanism which transfers a wafer among three transfer positions (a fifth transfer position TP5, a sixth transfer position TP6, and a seventh transfer position TP7 arranged in this order from the loading/unloading unit) located along a direction in which the polishing units 3C and 3D are arranged.

The wafer is transferred to the polishing units 3A and 3B by means of the first linear transporter 6. The top ring 31A of the first polishing unit 3A moves between a polishing position and the second transfer position TP2 in accordance with swing motions of a top ring head. The wafer is thus delivered to the top ring 31A at the second transfer position TP2. In like manner, the top ring 31B of the second polishing unit 3B moves between a polishing position and the third transfer position TP3, and the wafer is delivered to the top ring 31B at the third transfer position TP3. The top ring 31C of the third polishing unit 3C moves between a polishing position and the sixth transfer position TP6, and the wafer is delivered to the top ring 31C at the sixth transfer position TP6. The top ring 31D of the fourth polishing unit 3D moves between a polishing position and the seventh transfer position TP7, and the wafer is delivered to the top ring 31D at the seventh transfer position TP7.

Disposed in the first transfer position TP1 is a lifter 11 for receiving the wafer from the transfer robots 22. The wafer is delivered from the transfer robots 22 to the first linear transporter 6 via the lifter 11. A shutter (not shown) is provided in the partition wall 1a between the lifter 11 and the transfer robots 22. When the wafer is transferred, the shutter is opened, and the wafer is delivered from the transfer robots 22 to the lifter 11. A swing transporter 12 is so disposed as to be surrounded by the first linear transporter 6, the second linear transporter 7, and the cleaning unit 4. The swing transporter 12 has a hand which is movable between the fourth and fifth transfer positions TP4 and TP5. The swing transporter 12 is used to deliver the wafer from the first linear transporter 6 to the second linear transporter 7. The wafer is transferred to the third polishing unit 3C and/or the fourth polishing unit 3D by means of the second linear transporter 7. The wafer polished in the polishing unit 3 is transferred to the cleaning unit 4 via the swing transporter 12.

<Cleaning Unit>

Figure 3A:
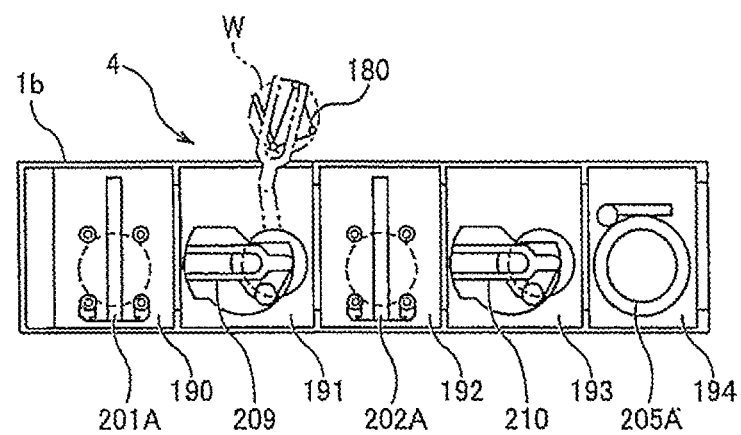
FIG. 3A is a plan view of a cleaning unit.
Figure 3B:
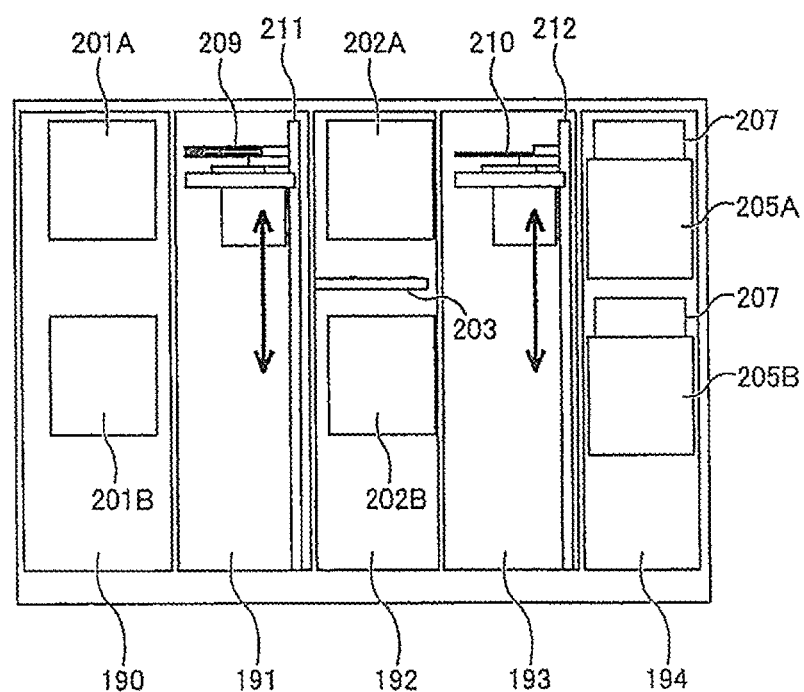
FIG. 3B is a side view of the cleaning unit.

FIG. 3A is a plan view of the cleaning unit 4. FIG. 3B is a side view of the cleaning unit 4. As illustrated in FIGS. 3A and 3B, the cleaning unit 4 is partitioned into a first cleaning chamber 190, a first transfer chamber 191, a second cleaning chamber 192, a second transfer chamber 193, and a drying chamber 194. In the first cleaning chamber 190, there are disposed an upper primary cleaning module 201A and a lower primary cleaning module 201B, which are arranged in a vertical direction. The upper primary cleaning module 201A is located above the lower primary cleaning module 201B. In a similar manner, in the second cleaning chamber 192, an upper secondary cleaning module 202A and a lower secondary cleaning module 202B are arranged in a vertical direction. The upper secondary cleaning module 202A is located above the lower secondary cleaning module 202B. The primary and secondary cleaning modules 201A, 201B, 202A, and 202B are cleaning machines which clean the wafer with a cleaning liquid. The primary and secondary cleaning modules 201A, 201B, 202A, and 202B are arranged in a vertical direction, which provides an advantage of providing a small footprint area.

A shelf 203 in which the wafer is temporarily placed is provided between the upper and lower secondary cleaning modules 202A and 202B. In the drying chamber 194, there are disposed an upper drying module 205A and a lower drying module 205B, which are arranged in a vertical direction. The upper drying module 205A and the lower drying module 205B are separated from each other. A filter fan unit 207 is disposed on top of each of the upper and lower drying modules 205A and 205B. The filter fan units 207 supply clean air into the drying modules 205A and 205B. The upper primary cleaning module 201A, the lower primary cleaning module 201B, the upper secondary cleaning module 202A, the lower secondary cleaning module 202B, the shelf 203, the upper drying module 205A, and the lower drying module 205B are secured to a frame (not shown) by means of bolts or the like.

The first transfer chamber 191 accommodates a first transfer robot (transfer mechanism) 209 which is vertically movable. The second transfer chamber 193 accommodates a second transfer robot 210 which is vertically movable. The first and second transfer robots 209 and 210 are movably supported by support shafts 211 and 212 extending in a vertical direction. The first transfer robot 209 and the second transfer robot 210 each have a driving mechanism, such as a motor, in the inside thereof. The first transfer robot 209 and the second transfer robot 210 are vertically movable along the support shafts 211 and 212, respectively. The first transfer robot 209 has two hands vertically aligned as with the transfer robots 22. The first transfer robot 209 is located in such a position that the lower hand thereof is capable of reaching a shelf 180 for temporary placement of the wafer, as shown by dotted lines in FIG. 3A. When the lower hand of the first transfer robot 209 reaches the shelf 180, a shutter (not shown) provided in the partition wall 1b is opened.

The first transfer robot 209 operates so as to transfer the wafer W among the shelf 180, the upper primary cleaning module 201A, the lower primary cleaning module 201B, the shelf 203, the upper secondary cleaning module 202A, and the lower secondary cleaning module 202B. The first transfer robot 209 uses the lower hand when transferring the wafer to be cleaned (a wafer applied with slurry), and uses the upper hand when transferring the cleaned wafer. The second transfer robot 210 operates to transfer the wafer W among the upper secondary cleaning module 202A, the lower secondary cleaning module 202B, the shelf 203, the upper drying module 205A, and the lower drying module 205B. The second transfer robot 210 transfers only wafers which have been cleaned and therefore has only one hand. The transfer robots 22 illustrated in FIG. 1 use the upper hands to take out the wafers from the upper drying module 205A or the lower drying module 205B, and return the wafers to the wafer cassettes. When the upper hands of the transfer robots 22 reach the drying modules 205A and 205B, the shutter (not shown) provided in the partition wall 1a is opened.

<Pressure Calibration on Airbags>

First Embodiment

Figure 4:
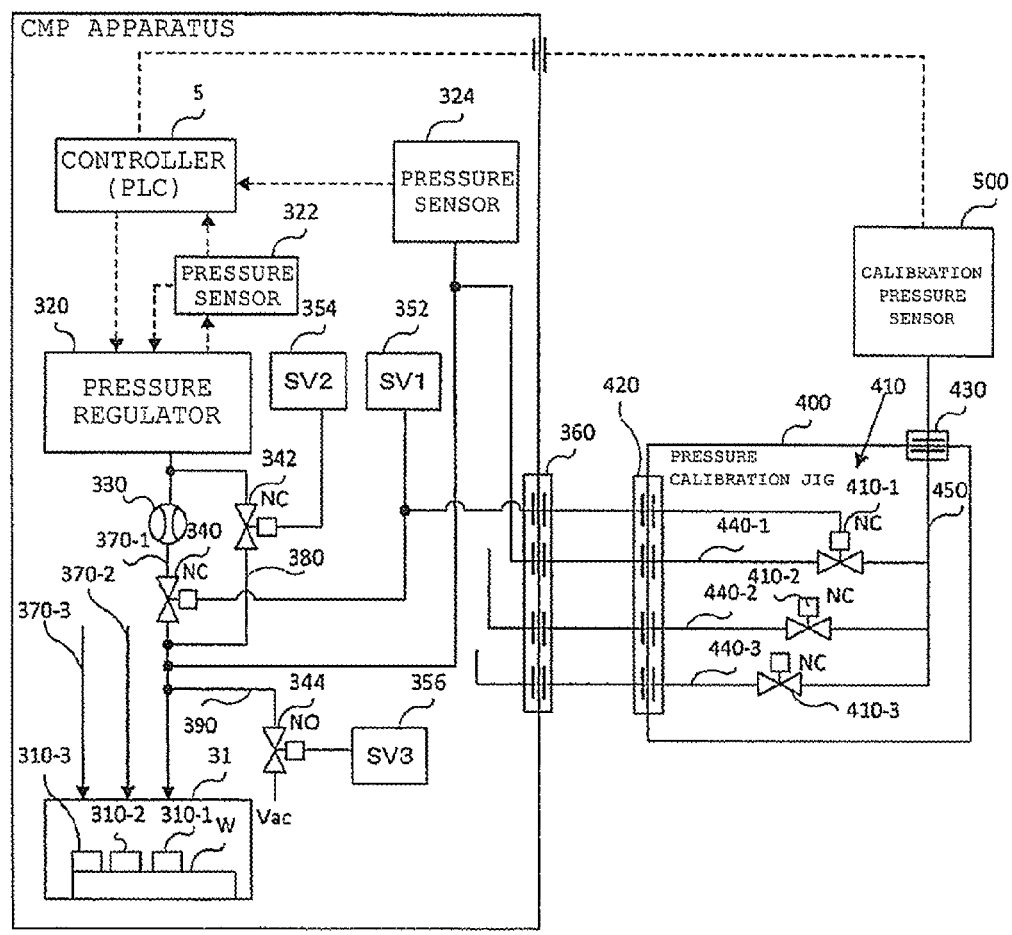
FIG. 4 shows an arrangement of a pressure calibration jig and that of a CMP apparatus according to a first embodiment.

Pressure calibration on airbags will be now described. FIG. 4 shows an arrangement of a pressure calibration jig and that of a CMP apparatus according to a first embodiment. For the sake of simplicity of description, FIG. 4 shows an example in which three airbags 310-1 to 310-3 are provided inside the top ring 31. However, the number of airbags is not limited to three and may be any number.

A pressure calibration jig 400 is a jig for calibrating the pressure applied to the plurality of airbags 310-1 to 310-3 provided inside the top ring 31. As illustrated in FIG. 4, the pressure calibration jig 400, in use, is connected to the CMP apparatus and a calibration pressure sensor 500. To be more specific, the CMP apparatus has a multi-connector 360 which enables fluid conduction through a plurality of flow passages. The pressure calibration jig 400 has a multi-connector 420 which enables fluid conduction through a plurality of flow passages. The CMP apparatus and the pressure calibration jig 400 are connected to each other through the multi-connectors 360 and 420. The pressure calibration jig 400 has a connector 430 for fluid conduction through a flow passage. The pressure calibration jig 400 is connected to the calibration pressure sensor 500 through the connector 430.

The pressure calibration jig 400 has a plurality of first passages 440-1 to 440-3 capable of being communicated with the plurality of airbags 310-1 to 310-3, respectively. The CMP apparatus specifically comprises a pressure regulator 320 for applying pressure (air pressure, for example) to the plurality of airbags 310-1 to 310-3. The pressure regulator 320 is connected to the plurality of airbags 310-1 to 310-3 through a plurality of main passages 370-1 to 370-3. For simplicity of description, FIG. 4 merely illustrates the arrangement of the main passage 370-1. The main passage 370-1 is provided with an on-off valve (second on-off valve) 340 which opens/closes the main passage 370-1. A plurality of first passages 440-1 to 440-3 are communicated with the airbags 310-1 to 310-3, respectively, by being connected to the plurality of main passages 370-1 to 370-3 between the on-off valves 340 and the airbags 310.

The pressure calibration jig 400 has a second passage 450 for combining and connecting the plurality of first passages 440-1 to 440-3 to the calibration pressure sensor 500. As illustrated in FIG. 4, the first passages 440-1 to 440-3 merge into the second passage 450. The second passage 450 is connected to the calibration pressure sensor 500 via the connector 430.

The pressure calibration jig 400 has a flow control portion 410. With respect to the first passage of the plurality of first passages 440-1 to 440-3 which corresponds to the airbag selected for pressure calibration, the flow control portion 410 allows a fluid to flow in a direction from the airbag 310 toward the second passage 450. At the same time, the flow control portion 410 prevents the fluid from flowing in a direction from the second passage 450 toward the airbags 310 through the first passages other than the selected one.

Specifically, the flow control portion 410 includes a plurality of on-off valves (first on-off valves) 410-1 to 410-3 which are provided in the plurality of first passages 440-1 to 440-3, respectively, and which open/close the plurality of first passages 440-1 to 440-3, respectively. The plurality of one-off valves 410-1 to 410-3 is adapted to operate in synchronization with the on-off valves 340 provided in the plurality of main passages 370-1 to 370-3, which main passages connect the pressure regulator 320 to the plurality of airbags 310-1 to 310-3.

The main passage 370-1 is opened/closed by the on-off valve 340 in accordance with control air pressure that is outputted from a solenoid valve (SV1) 352. The control air pressure outputted from the solenoid valve 352 is also supplied through the multi-connectors 360 and 420 to the on-off valve 410-1. This brings the on-off valve 340 and the on-off valve 410-1 (solenoid valve 352) into synchronization. Each of the on-off valves 340 and 410-1 is a normally closed (NC) on-off valve which is normally closed, and is open during air pressurization. When the on-off valve 340 is open, the on-off valve 410-1 is also open. When the on-off valve 340 is closed, the on-off valve 410-1 is closed. The same applies to the main passages 370-2 and 370-3. For example, the main passage 370-2 and the first passage 440-2 communicate with each other, and the control air pressure for controlling the opening/closing of the on-off valve 340 provided in the main passage 370-2 is applied to the on-off valve 410-2.

The following description explains the calibration (correction) on pressure of the airbags 310. As an example, calibration on the airbag 310-1 is explained. First, calibration (correction) is carried out on a D/A value which is sent from the controller (PLC) 5 to the pressure regulator 320. The controller 5 sends to the pressure regulator 320 a command value (D/A value) for enabling the airbag 310-1 to have a predetermined pressure (25 hPa, for example). The pressure regulator 320 pressurizes the airbag 310-1 in accordance with the command value received from the controller 5.

During the calibration, the on-off valve 340 is controlled to be open, and the on-off valve 410-1 is also controlled to be open in synchronization with the on-off valve 340. The pressure applied to the airbag 310-1 is accordingly supplied through the main passage 370-1, the first passage 440-1, and the second passage 450 to the calibration pressure sensor 500.

On the other hand, the on-off valves 410-2 and 410-3 are controlled to be closed, so that the pressure applied to the second passage 450 is not transmitted to the airbags 310-2 and 310-3. This enables the calibration pressure sensor 500 to measure only the pressure applied to the airbag 310-1. A pressure value measured by the calibration pressure sensor 500 is fed back to the controller 5.

The controller 5 performs the above-described processing with respect to different pressures (for example, 100 hPa, 200 hPa, etc.) in the same manner. Based on the pressure value that is fed back from the calibration pressure sensor 500, calibration is carried out on the D/A value which is sent from the controller 5 to the pressure regulator 320. Specifically, if a measured pressure value is higher than the command value, correction is performed so as to reduce the D/A value. If the measured pressure value is lower than the command value, correction is performed so as to increase the D/A value. Correction is not performed if the measured pressure value is equal to the command value.

After the calibration of the D/A value which is sent from the controller 5 to the pressure regulator 320 is finished on the airbag 310-1, the controller 5 carries out the calibration in the same manner on the other airbags 310-2 and 310-3.

After the calibration of the D/A value which is sent from the controller 5 to the pressure regulator 320 is finished on all the airbags 310-1 to 310-3, the controller 5 carries out the calibration of an A/D value of pressure which is sent from a pressure sensor 322 located inside the CMP apparatus to the controller 5.

Specifically, the controller 5 sends to the pressure regulator 320 a command value (D/A value) for obtaining a predetermined pressure (25 hPa, for example). The pressure regulator 320 pressurizes the pressure sensor 322 in accordance with the command value received from the controller 5. The pressure value measured by the pressure sensor 322 is fed back to the controller 5.

The controller 5 carries out the above-described processing with respect to different pressures (for example, 100 hPa, 200 hPa, etc.) in the same manner. Based on the pressure value which is fed back from the pressure sensor 322, calibration is carried out on the A/D value of pressure which is sent from the pressure sensor 322 to the controller 5. Specifically, if the measured pressure value is higher than the command value, correction is performed so as to reduce the A/D value. If the measured pressure value is lower than the command value, correction is performed so as to increase the A/D value. If the measured pressure value is equal to the command value, the correction is not performed.

After the calibration of the A/D value of pressure which is sent from the pressure sensor 322 to the controller 5 is finished, the controller 5 carries out the calibration of the A/D value of pressure which is sent from the pressure sensor 324 located inside the CMP apparatus to the controller 5.

Specifically, the controller 5 sends to the pressure regulator 320 a command value (D/A value) for enabling the airbag 310-1 to have a predetermined pressure (25 hPa, for example). The pressure regulator 320 pressurizes the airbag 310-1 in accordance with the command value received from the controller 5. The pressure applied to the airbag 310-1 is measured by the pressure sensor 324. The pressure value measured by the pressure sensor 324 is fed back to the controller 5.

The controller 5 carries out the above-described processing with respect to different pressures (for example, 100 hPa, 200 hPa, etc.) in the same manner. In accordance with the pressure value that is fed back from the pressure sensor 324, calibration is carried out on the A/D value of pressure which is sent from the pressure sensor 324 to the controller 5. Specifically, if the measured pressure value is higher than the command value, correction is performed so as to reduce the A/D value. If the measured pressure value is lower than the command value, correction is performed so as to increase the A/D value. Correction is not performed if the measured pressure value is equal to the command value.

After the calibration of the A/D value of pressure which is sent from the pressure sensor 324 to the controller 5 is finished with respect to the airbag 310-1, the controller 5 carries out the calibration in the same manner on the other airbags 310-2 and 310-3.

As described above, according to the first embodiment, the airbag calibration can be simplified. According to conventional art, it is required to repeat, according to the number of airbags, an operation of connecting the calibration pressure sensor to a target airbag to perform calibration and, after the calibration is finished, reconnecting the calibration pressure sensor to another target airbag to perform calibration. This requires more operators and longer time for the calibration. In contrast, according to the first embodiment, it is possible to automatically carry out the calibration on a plurality of airbags after the pressure calibration jig 400 is connected to the CMP apparatus and the calibration pressure sensor 500. The first embodiment therefore makes it possible to carry out the calibration of pressures of a plurality of airbags in a shorter time and with less effort.

Second Embodiment

Figure 5:
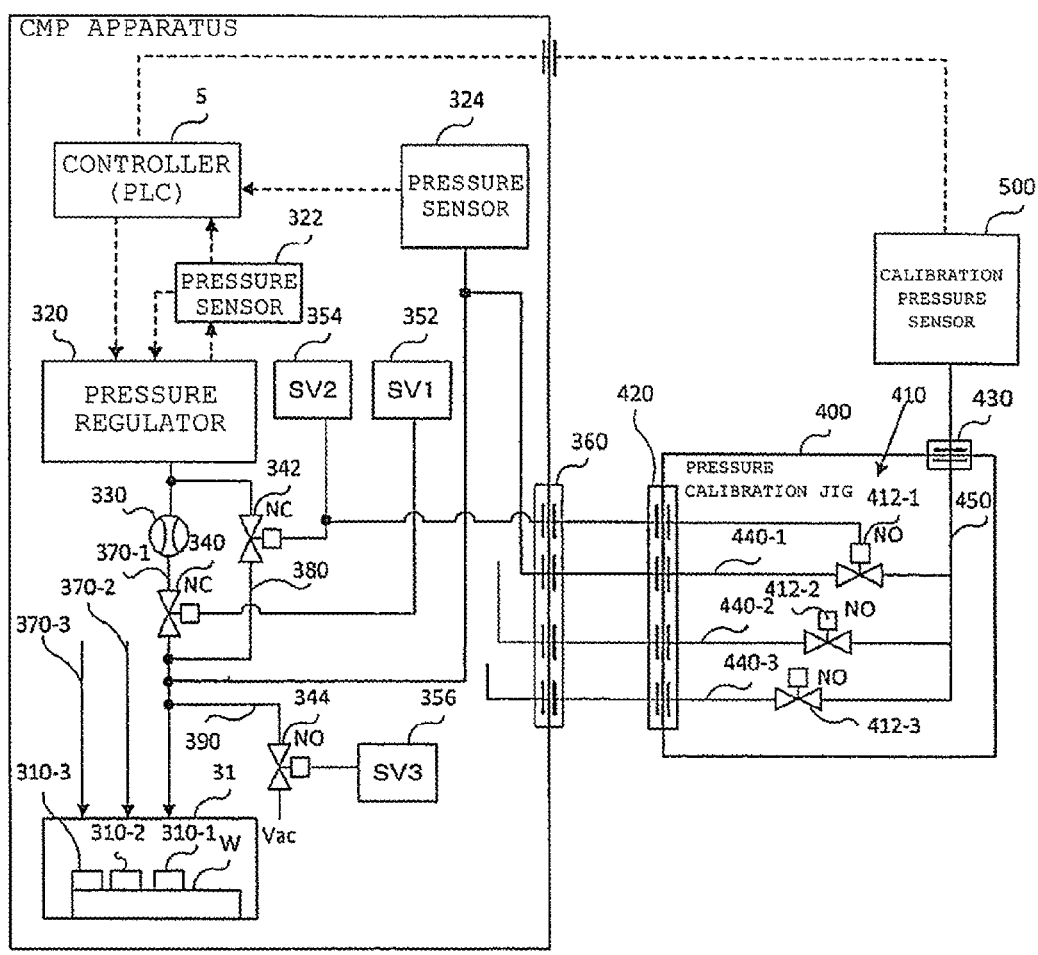
FIG. 5 shows an arrangement of a pressure calibration jig and that of a CMP apparatus according to a second embodiment.

Pressure calibration on airbags according to a second embodiment will be now described. FIG. 5 shows an arrangement of the pressure calibration jig and that of the CMP apparatus according to the second embodiment. The second embodiment differs from the first embodiment in that the on-off valves located inside the pressure calibration jig 400 are changed from the normally closed on-off valves to normally open on-off valves, and that connections of control signals for the on-off valves placed in the pressure calibration jig 400 are changed. As the other arrangements are the same as those of the first embodiment, the following description will explain only matters different from the first embodiment.

The flow control portion 410 includes a plurality of first on-off valves 412-1 to 412-3 which are provided in the plurality of first passages 440-1 to 440-3, respectively, and which open/close the plurality of first passages 440-1 to 440-3, respectively. The first on-off valves 412-1 to 412-3 are normally open (NO) on-off valves which are normally open and are closed during air pressurization.

As to the main passage 370-1, a flowmeter 330 is provided in the main passage 370-1 between the on-off valve 340 and the pressure regulator 320. The main passage 370-1 is further provided with a bypass passage 380 bypassing the flowmeter 330 and the on-off valve 340. The bypass passage 380 is provided with an on-off valve (third on-off valve) 342 which opens/closes the bypass passage 380. The bypass passage 380 is provided for quick start of pressurization on the airbag 310-1. In other words, the bypass passage 380 is provided for suppressing a delay in the start of pressurization on the airbag 310-1, which is otherwise caused by restriction in the flowmeter 330. The main passages 370-2 and 370-3 are configured similarly to the main passage 370-1.

The plurality of first on-off valves 412-1 to 412-3 are adapted to operate in synchronization with the third on-off valve 342. Specifically, the on-off valve 342 for the main passage 370-1 is opened/closed according to a control air pressure that is outputted from a solenoid valve (SV2) 354. The control air pressure outputted from the solenoid valve 354 is connected through the multi-connectors 360 and 420 to the on-off valve 412-1. Thus, the on-off valve 342 (solenoid valve 354) and the on-off valve 412-1 are synchronized with each other. The on-off valve 342 is a normally closed on-off valve, whereas the on-off valve 412-1 is a normally open on-off valve. Therefore, when the on-off valve 342 is open, the on-off valve 412-1 is closed. When the on-off valve 342 is closed, the on-off valve 412-1 is open. The same applies to the main passages 370-2 and 370-3.

As described above, according to the second embodiment, the airbag calibration can be simplified as in the first embodiment. Further, according to the second embodiment, in which the on-off valve 412 in the pressure calibration jig 400 is synchronized with the on-off valve 342 (solenoid valve 354) of the bypass passage 380, it is possible to prevent a leakage among the first passages 440 in the pressure calibration jig 400. The reason for this is as follows. There is a case that the solenoid valve 352 is turned on when the airbags 310 are pressurized, turned off when the airbags 310 are sucked, and turned on when the airbags are free from both pressurization and suction. In this case, the operation of the solenoid valve 352 when the airbags are pressurized and the operation of the solenoid valve 352 when the airbags are free are the same. Therefore, if the on-off valves 412 are synchronized with the solenoid valve 352, there is a possibility that all the on-off valves 412 in the pressure calibration jig 400 will be opened, thus generating a leakage among the first passages 440.

In the second embodiment, the solenoid valve 354 is turned off when the airbags 310 are pressurized, turned off when the airbags 310 are sucked, and turned on when the airbags are free from both pressurization and suction. Thus, the operation of the solenoid valve 354 when the airbags are pressurized and the operation of the solenoid valve 354 when the airbags are free are different. Therefore, it is possible to open the first passage corresponding to the airbag targeted for pressure calibration while closing the other first passages. This makes it possible, with respect to the first passage corresponding to the airbag targeted for pressure calibration, to allow fluid to flow from the airbag toward the second passage while preventing the fluid from flowing from the second passage toward the airbags with respect to the other first passages.

Third Embodiment

Figure 6:
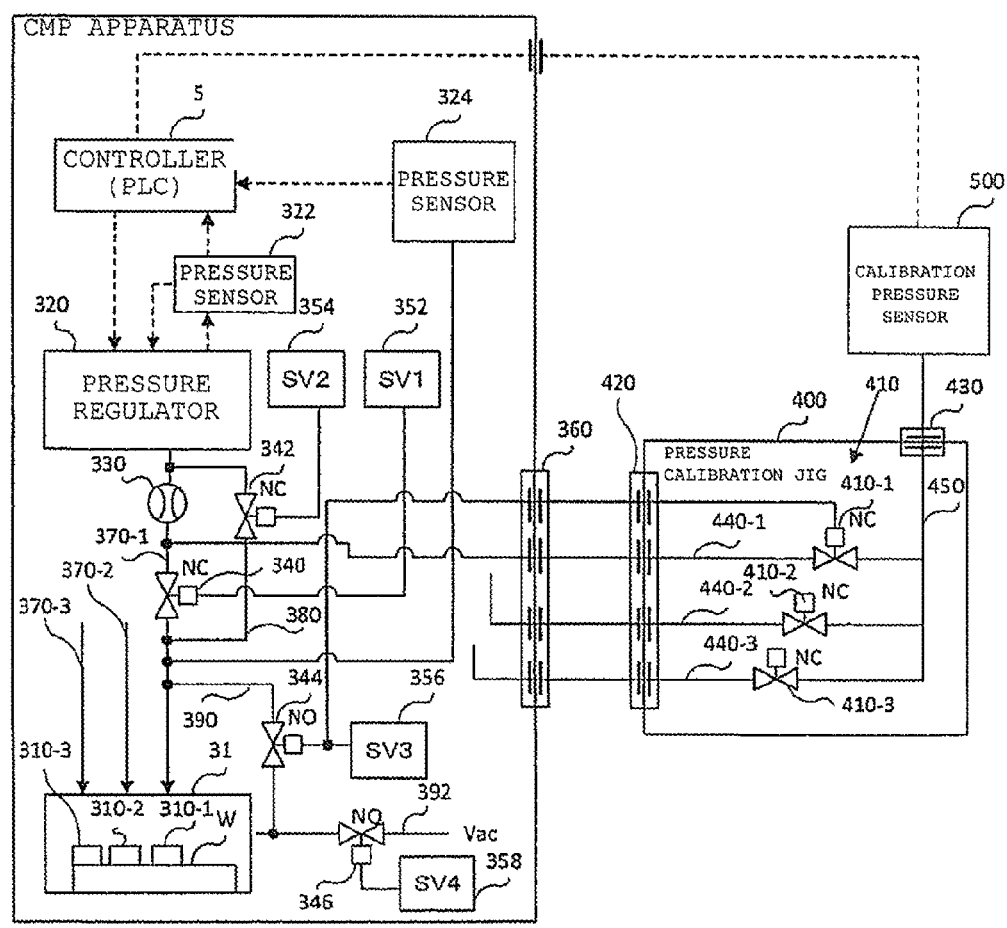
FIG. 6 shows an arrangement of a pressure calibration jig and that of a CMP apparatus according to a third embodiment.

Pressure calibration on airbags according to the third embodiment will be now described. FIG. 6 shows an arrangement of the pressure calibration jig and that of the CMP apparatus according to the third embodiment. The third embodiment differs from the first embodiment in that connections of the first passages 440-1 to 440-3, and connections of the control air pressures for the on-off valves placed in the pressure calibration jig 400 are changed. As the other arrangements are the same as those of the first embodiment, the description will refer to only matters different from the first embodiment.

The flow control portion 410 includes the plurality of on-off valves 410-1 and 410-3 which are provided in the plurality of first passages 440-1 to 440-3, respectively, and which open/close the plurality of first passages 440-1 to 440-3, respectively. A suction passage 390 diverges from the main passage 370-1 at a point between the airbag 310-1 and the on-off valve 340. The suction passage 390 is provided with an on-off valve (fourth on-off valve) 344 which opens/closes the suction passage 390. The on-off valve 344 is opened/closed in accordance with a control air pressure outputted from a solenoid valve (SV3) 356. The main passages 370-2 and 370-3 are similarly configured to the main passage 370-1.

The plurality of suction passages 390 diverging from the main passages 370-1 to 370-3 join a single suction passage 392. For sucking the wafer W onto the top ring 31, the airbag 310 is placed under vacuum through the suction passage 392. The suction passage 392 is provided with an on-off valve (fifth on-off valve) 346 which opens/closes the suction passage 392. The on-off valve 346 is opened/closed according to a control air pressure outputted from a solenoid valve (SV4) 358.

The plurality of on-off valves 410-1 to 410-3 are adapted to operate in synchronization with the on-off valve 344. Specifically, the main passage 370-1 is opened/closed by the on-off valve 344 according to the control air pressure outputted from the solenoid valve (SV3) 356. The control air pressure outputted from the solenoid valve 356 is connected to the on-off valve 410-1 through the multi-connectors 360 and 420. This enables the on-off valve 344 (solenoid valve 356) and the on-off valve 410-1 to synchronize with each other. The on-off valve 344 is a normally open on-off valve, and the on-off valve 410-1 is a normally closed on-off valve. When the on-off valve 344 is open, the on-off valve 410-1 is closed. When the on-off valve 344 is closed, the on-off valve 410-1 is open. During the calibration on the airbag 310-1, the on-off valve 344 in communication with the main passage 370-1 is closed, and the on-off valve 410-1 is open. During the calibration on the airbag 310-1, the on-off valves 344 in communication with the main passages 370-2 and 370-3 are open, and the on-off valves 410-2 and 410-3 are closed. The same applies to the main passages 370-2 and 370-3.

The plurality of first passages 440-1 to 440-3 are respectively connected to the main passages 370-1 to 370-3 between the on-off valves 340 and the pressure regulator 320. More specifically, the plurality of first passages 440-1 to 440-3 are respectively connected to the main passages 370-1 to 370-3 between the on-off valves 340 and the flowmeters 330.

According to the third embodiment, the calibration on airbags can be simplified as in the first embodiment. Further, according to the third embodiment, it is possible to prevent the polishing pad 10 from losing its shape as a result of the wafer W being pressed against the polishing pad for preventing an air leakage from the airbags 310 during the calibration on the airbags. Air leaks from the airbag if the wafer W is not set on the airbag during the calibration on the airbag. As a countermeasure, it is considered to set the wafer W on the airbag and then press it against the polishing pad 10. In this case, however, it is required to prepare the wafer W, and there is a possibility that the polishing pad 10 will lose the shape thereof as a result of being pressed.

According to the third embodiment, the first passages 440-1 to 440-3 are respectively connected to the main passages 370-1 to 370-3 between the on-off valves 340 and the pressure regulator 320. In the third embodiment, therefore, the on-off valves 410-1 to 410-3 are adapted to operate in synchronization with the on-off valves 344. The third embodiment is thus capable of eliminating the necessity of preparing the wafer W and capable of preventing occurrence of shape loss of the polishing pad 10 during the calibration on the airbags.

Further, according to the third embodiment, it is possible to prevent the airbags from being undesirably vacuum-sucked during calibration. During calibration, the on-off valve 346 is closed. The on-off valve 346 is an on-off valve functioning as a main valve for vacuum-suction. Therefore, even if any one of the suction passages 390 is open, the undesirable vacuum-suction of the airbags can be prevented by closing the on-off valve 346.

According to the third embodiment, when the airbags are pressurized during a normal operation in which calibration is not performed, the on-off valves 340 are controlled to be open, and the on-off valves 342, 344 and 346 are controlled to be closed. When the airbags are sucked during the normal operation, the on-off valves 340 and 342 are controlled to be closed, and the on-off valves 344 and 346 are controlled to be open. When the airbags are neither pressurized nor sucked during the normal operation, the on-off valves 340 and 342 are controlled to be open, and the on-off valves 344 and 346 are controlled to be closed.

According to the third embodiment, during a time period when the calibration of the airbag 310-1, for example, is actually carried out in a mode for performing the calibration, the on-off valves 340 and 342 are controlled to be closed; the on-off valves 344 and 346 are controlled to be closed; the on-off valve 410-1 is controlled to be open; and the on-off valves 410-2 and 410-3 are controlled to be closed. If the calibration is not carried out in the mode for performing the calibration, the on-off valves 340, 342 and 346 are controlled to be closed; the on-off valves 344 are controlled to be open; and the on-off valves 410-1 to 410-3 are controlled to be closed.

Fourth Embodiment

Figure 7:
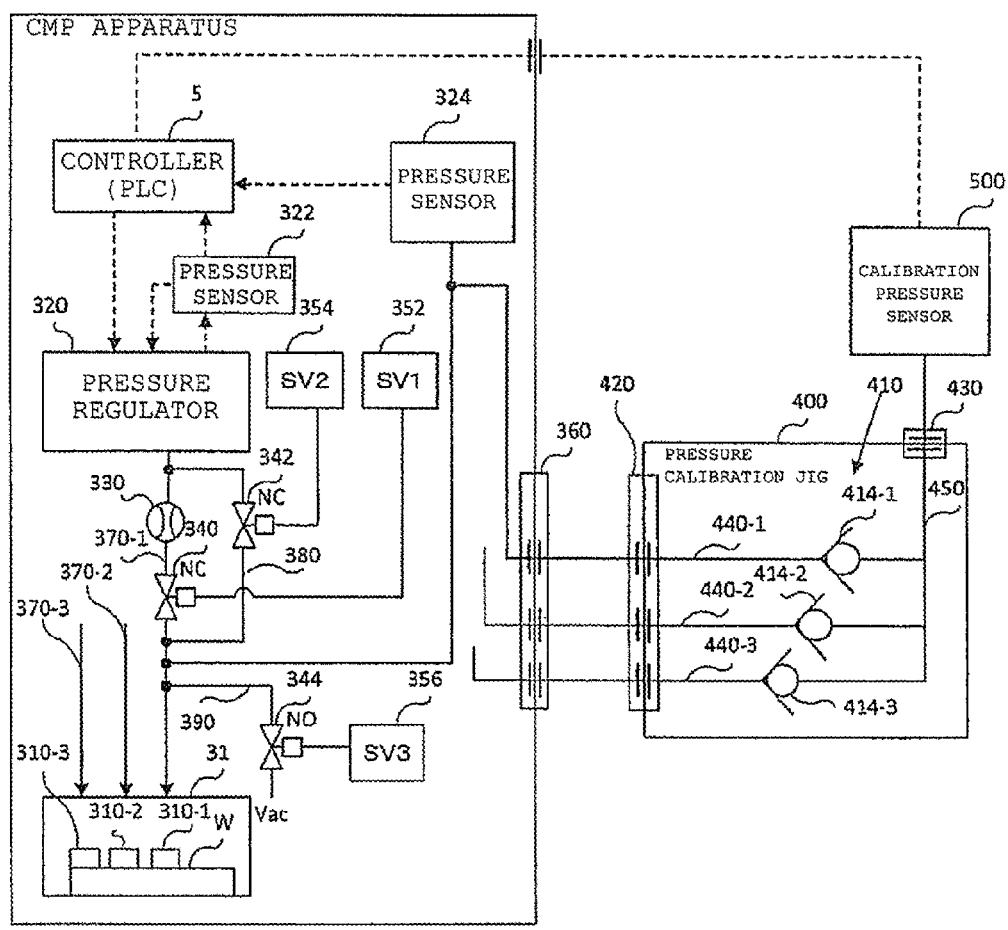
FIG. 7 shows an arrangement of a pressure calibration jig and that of a CMP apparatus according to a fourth embodiment.

Pressure calibration on airbags according to a fourth embodiment will be now described. FIG. 7 shows an arrangement of the pressure calibration jig and that of the CMP apparatus according to the fourth embodiment. The fourth embodiment differs from the first embodiment in that the on-off valves in the pressure calibration jig 400 are replaced by check valves, and that control air passages for controlling the on-off valves in the pressure calibration jig 400 are eliminated. As the other arrangements are the same as those of the first embodiment, the description will refer to only matters different from the first embodiment.

The flow control portion 410 includes a plurality of check valves (non-return valves) 414-1 to 414-3 which are provided in the plurality of first passages 440-1 to 440-3, respectively, and which allow a fluid to flow only in a direction from the airbags 310 toward the second passage 450.

According to the fourth embodiment, among the on-off valves 340 provided in the main passages 370-1 to 370-3, the on-off valve 340 corresponding to the airbag to be calibrated is controlled to be open, and the other on-off valves 340 corresponding to the airbags which are not calibration targets are controlled to be closed.

For example, when the airbag 310-1 is to be calibrated, the on-off valve 340 provided in the main passage 370-1 is opened, and the on-off valves provided in the main passages 370-2 and 370-3 are closed. The fluid flowing through the main passage 370-1 is supplied through the first passage 440-1, the check valve 414-1, and the second passage 450 to the calibration pressure sensor 500. Since the first passages 440-2 and 440-3 are provided with the check valves 414-2 and 414-3, the fluid does not flow in a direction from the second passage 450 toward the airbags 310-2 and 310-3. This makes it possible to perform accurate calibration on pressure of the airbag 310-1.

Assuming that the CMP apparatus side is primary, and the calibration pressure sensor 500 side is secondary, the fourth embodiment controls a pressurized fluid to flow only in a direction from the primary side to the secondary side, and thus prevents the fluid from leaking into an area other than an area in which pressurization is carried out. Further, the fourth embodiment eliminates the necessity of controlling the opening/closing of the valves in the pressure calibration jig 400. The structure of the pressure calibration jig 400 of the fourth embodiment is therefore simple as compared to the first to third embodiments.

If the check valves are provided in the first passages (conduits) 440-1 to 440-3 in the pressure calibration jig 400, it is impossible to drain the fluid which has entered the conduits of the jig. As a result, the fluid remains in the conduits even if the airbags are not under pressurization. Therefore, in order to drain the fluid existing in the unpressurized conduits, an air-operated valve for exhaustion may be provided in a branch passage disposed in the vicinity of the calibration pressure sensor 500. Specifically, a normally open valve with a secondary side open into the atmosphere may be provided and connected to operating air conduits of the CMP apparatus-side valves which are adapted to open only when the airbags are pressurized. The operating air conduits for all airbags are joined together and connected to the normally open valve. The normally open valve is thus closed when any one of the airbags is pressurized, and is open otherwise. The fluid remaining in the conduits therefore can be released into the atmosphere when the pressurization is not carried out.

<Flowchart>

Figure 8:
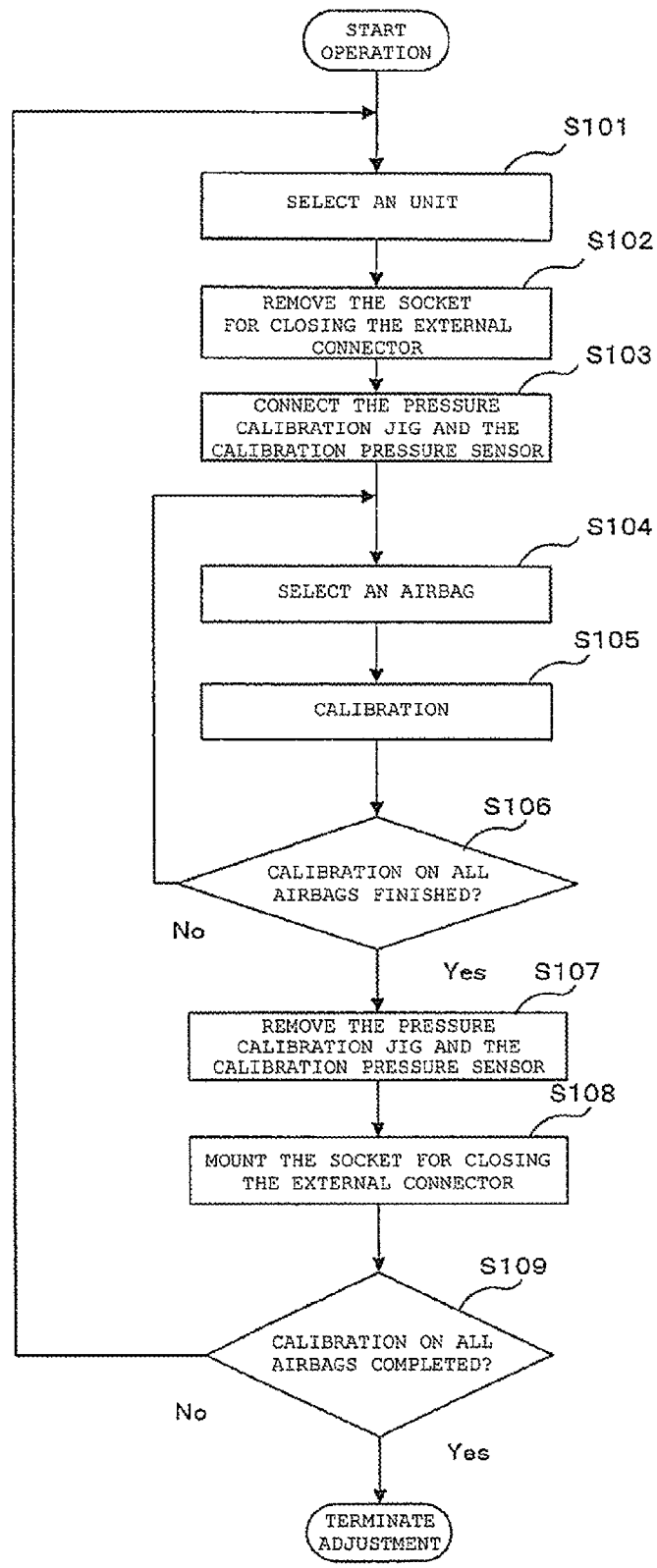
FIG. 8 is a flowchart of calibration using a pressure calibration jig.

A processing flow in calibration using the pressure calibration jig according to each of the first to fourth embodiments will be explained below. FIG. 8 is a flowchart of calibration using the pressure calibration jig.

As illustrated in FIG. 8, a calibration method starts with selection of a unit (Step S101). Specifically, in the calibration method, a unit to be calibrated is selected from the first polishing unit 3A, the second polishing unit 3B, the third polishing unit 3C, and the fourth polishing unit 3D of the CMP apparatus.

Then, in the calibration method, a socket for closing an external connector is removed (Step S102). Normally, in the CMP apparatus, the socket for closing an external connector is attached to the multi-connector 360 so as to prevent terminals of the multi-connector 360 from being exposed. For performing calibration, the socket for closing an external connector is removed.

Then, the pressure calibration jig 400 and the calibration pressure sensor 500 are connected to the CMP apparatus (Step S103), and an airbag is selected (Step S104). When FIGS. 4 to 7 are taken as an example, an airbag to be calibrated is selected from the airbags 310-1 to 310-3.

In the next step, calibration is executed (Step S105). The calibration is carried out in the procedures described above.

Then, a determination is made as to whether the calibration is finished on all the airbags in the polishing unit to be calibrated (Step S106).

If it is determined that the calibration is not finished on all the airbags ("NO" in Step S106), the calibration method returns to Step S104 and selects the airbag which has not yet been subject to the calibration.

If it is determined that the calibration is finished on all the airbags ("YES" in Step S106), the pressure calibration jig 400 and the calibration pressure sensor 500 are removed from the CMP apparatus (Step S107), and then the socket for closing an external connector is attached to the multi-connector 360 (Step S108).

Subsequently, a determination is made as to whether the calibration is finished in all the polishing units (Step S109). If it is determined that the calibration is not finished in all the polishing units ("NO" in Step S109), the calibration method returns to Step S101 and selects the polishing unit which has not yet been subject to the calibration.

If it is determined that the calibration is finished in all the polishing units ("YES" in Step S109), the calibration processing is terminated.

The pressure calibration jig 400 according to each of the first to fourth embodiments makes it possible to connect all the airbags in each of the polishing units to the calibration pressure sensor 500 collectively and automatically select only the airbag pressure to be measured.

In this light, the pressure measurement and the parameter change of the CMP apparatus can be semi-automated by using auto-calibration tools in the CMP apparatus. It is possible to reduce the time for operation by automatically executing, in the CMP apparatus, a series of operations conducted manually in conventional methods, including the acquisition of measured pressure values, the calculation of post-calibration parameters from the measured values, and the application of the parameters. However, even if the calibration is automated, the connection between the target airbag and the calibration pressure sensor 500 still needs to be manually switched, and the operator has to repeat the operation of the apparatus and the change of connection alternately. If this process can be omitted, the time for operation can be further reduced.

In order to omit the operation of disassembling the polishing unit and connecting each airbag to the calibration pressure sensor 500 every time measurement is conducted, it is considered to extend conduits from the respective airbags to the outside of the polishing unit, and provide a connector for enabling the conduits to be collectively connected to the calibration pressure sensor 500 outside the polishing unit. By connecting the calibration pressure sensor 500 to this connector, all the airbags in the polishing table can be connected to the calibration pressure sensor 500. However, the pressurized fluid cannot be prevented from leaking from and into the airbags during pressurization simply by connecting all the airbags to the calibration pressure sensor 500. It is then impossible to measure accurate pressure. To solve this, the pressure calibration jig 400 according to each of the first to fourth embodiments is provided between the connector and the calibration pressure sensor 500. This makes it possible to connect only the airbag to be measured to the calibration pressure sensor 500.

The pressure calibration jig 400 according to each of the first to third embodiments is arranged such that a valve manifold is provided in the pressure calibration jig 400. One valve is provided for each airbag area. The valve is controlled in a manner such that it is open during pressurization, and closed otherwise. The valve is of an air-operated type and operated by using operating air in the CMP apparatus. More specifically, the operating air conduits for the apparatus-side valves which are adapted to operate during the pressurization of the airbags are connected to the pressure calibration jig 400-side valves, to thereby enable a synchronous operation of the apparatus-side valves and the pressure calibration jig 400-side valves. By this method, it becomes possible to automatically open only the valve of the airbag being pressurized and bring the valve into connection with the calibration pressure sensor 500. With regard to a manner of operation of the valves located on the pressure calibration jig 400 side, either a normally-closed (NC) type or a normally-open (NO) type may be employed. When the NC valve is employed, the valve is open during the operating air pressurization, and closed otherwise. Therefore, the NC valve can be operated by being synchronized with the valve which operates only during the airbag pressurization, among the valves located in the CMP apparatus. On the other hand, when the NO valve is employed, the NO valve is closed during the operating air pressurization, and open otherwise. Thus, the NO valve operates in an opposite way to the NC valve. Therefore, an intended operation can be performed by synchronizing the NO valve and the valve which is closed during the airbag pressurization.

The fourth embodiment relates to a method in which a check valve is provided in each airbag conduit in the pressure calibration jig 400. The CMP apparatus side is set as a primary side, and the calibration pressure sensor 500 side is set as a secondary side, to thereby provide a flow of the pressurized fluid only in the direction from the CMP apparatus toward the calibration pressure sensor 500. This prevents the fluid from leaking to an area other than the area in which pressurization is carried out.

The foregoing embodiments enable the measurement of the pressure at the time of pressurization of a selected airbag without the change of connection of the conduits and a separate operation other than the operation of the CMP apparatus. In a conventional calibration method, about three hours for operation and two operators are required with respect to each polishing table. In contrast, the means according to the present embodiments can reduce the time for operation and the number of operators, and therefore requires about 45 minutes and one operator with respect to each polishing table. The embodiments thus enable a marked improvement in operation efficiency in the startup or maintenance of the polishing apparatus.

According to conventional methods, airbag conduits in the vicinity of airbag membranes are removed and connected to the calibration pressure sensor 500. This causes a risk such as an error in connection when the conduits are reconnected after calibration. In the present embodiments, however, the airbag conduits are collectively connected to the calibration pressure sensor 500 by means of the pressure calibration jig 400, and therefore have an effect in preventing an error in operation when connecting the conduits. According to conventional methods, values of the calibration pressure sensor 500 are measured by operators themselves, and therefore dispersion in measurement results may occur depending on the operator. The embodiments of the present invention automatically carry out the pressure measurement and the parameter calculation. The embodiments thus make it possible to prevent dispersion in measurement results and increase stability of calibration.

REFERENCE SIGNS LIST

31A, 31B, 31C, 31D top ring
310 airbag
320 pressure regulator
340, 342, 344, 346 on-off valve
352, 354, 356 solenoid valve
360, 420 multi-connector
370-1 to 370-3 main passage
380 bypass passage
390, 392 suction passage
400 pressure calibration jig
410 control portion
410-1 to 410-3 on-off valve
412 on-off valve
414 check valve
430 connector
440-1 to 440-3 first passage
450 second passage
500 calibration pressure sensor
W wafer

What is claimed is:

1. A pressure calibration jig used for calibrating pressure applied to a plurality of airbags disposed inside a holding portion configured to hold and press a substrate against a polishing tool, comprising:
    a plurality of first passages capable of being communicated with the plurality of airbags, respectively;
    a second passage configured to combine and connect the plurality of first passages to a pressure sensor for pressure calibration; and
    a flow control portion configured to allow a fluid to flow through the first passage of the plurality of first passages, which first passage corresponds to an airbag selected for pressure calibration, in a direction from the selected airbag toward the second passage, and also configured to prevent the fluid from flowing through the first passages other than the first passage corresponding to the selected airbag in a direction from the second passage toward the airbags.

2. The pressure calibration jig according to claim 1, wherein
    the flow control portion includes a plurality of first on-off valves respectively disposed in the plurality of first passages and configured to open/close the plurality of first passages;
    the plurality of first on-off valves are configured to operate in synchronization with second on-off valves, the second on-off valves being respectively disposed in a plurality of main passages which connect a pressure regulator provided inside a substrate processing apparatus comprising the holding portion to the plurality of airbags; and
    the plurality of first passages are connected to the main passages between the second on-off valves and the airbags.

3. The pressure calibration jig according to claim 1, wherein
    the flow control portion includes a plurality of first on-off valves respectively disposed in the plurality of first passages and configured to open/close the plurality of first passages;
    the plurality of first on-off valves are configured to operate in synchronization with third on-off valves, the third on-off valves being disposed in a plurality of bypass passages which bypass second on-off valves, the second on-off valves being respectively disposed in a plurality of main passages which connect a pressure regulator provided inside a substrate processing apparatus comprising the holding portion to the plurality of airbags; and
    the plurality of first passages are connected to the main passages between the second on-off valves and the airbags.

4. The pressure calibration jig according to claim 1, wherein
    the flow control portion includes a plurality of first on-off valves respectively disposed in the plurality of first passages and configured to open/close the plurality of first passages;
    the plurality of first on-off valves are configured to operate in synchronization with fourth on-off valves, the fourth on-off valves being respectively disposed in a plurality of suction passages which diverge from the airbag side of second on-off valves, the second on-off valves being respectively disposed in a plurality of main passages which connect a pressure regulator provided inside a substrate processing apparatus comprising the holding portion to the plurality of airbags; and
    the plurality of first passages are connected to the main passages between the second on-off valves and the pressure regulator.

5. The pressure calibration jig according to claim 1, wherein
    the flow control portion includes a plurality of check valves respectively disposed in the plurality of first passages and configured to allow a fluid to flow only in a direction from the airbags toward the second passage.

6. A pressure calibration jig used for calibrating pressure applied to a plurality of airbags disposed inside a holding portion configured to hold and press a substrate against a polishing tool, comprising:
    a plurality of first passages capable of being communicated with the plurality of airbags, respectively;
    a second passage configured to combine and connect the plurality of first passages to a pressure sensor for pressure calibration;
    a flow control portion configured to allow a fluid to flow through the first passage of the plurality of first passages, which first passage corresponds to an airbag selected for pressure calibration, in a direction from the selected airbag toward the second passage, and also configured to prevent the fluid from flowing through the first passages other than the first passage corresponding to the selected airbag in a direction from the second passage toward the airbags; and a multi-connector enabling fluid conduction through the plurality of first passages,
the pressure calibration jig being connected through the multi-connector to a substrate processing apparatus comprising the holding portion.

7. The pressure calibration jig according to claim 6, wherein
the flow control portion includes a plurality of first on-off valves respectively disposed in the plurality of first passages and configured to open/close the plurality of first passages;
the plurality of first on-off valves are configured to operate in synchronization with second on-off valves, the second on-off valves being respectively disposed in a plurality of main passages which connect a pressure regulator provided inside a substrate processing apparatus comprising the holding portion to the plurality of airbags; and
the plurality of first passages are connected to the main passages between the second on-off valves and the airbags.

8. The pressure calibration jig according to claim 6, wherein
the flow control portion includes a plurality of first on-off valves respectively disposed in the plurality of first passages and configured to open/close the plurality of first passages;
the plurality of first on-off valves are configured to operate in synchronization with third on-off valves, the third on-off valves being disposed in a plurality of bypass passages which bypass second on-off valves, the second on-off valves being respectively disposed in a plurality of main passages which connect a pressure regulator provided inside a substrate processing apparatus comprising the holding portion to the plurality of airbags; and
the plurality of first passages are connected to the main passages between the second on-off valves and the airbags.

9. The pressure calibration jig according to claim 6, wherein
the flow control portion includes a plurality of first on-off valves respectively disposed in the plurality of first passages and configured to open/close the plurality of first passages;
the plurality of first on-off valves are configured to operate in synchronization with fourth on-off valves, the fourth on-off valves being respectively disposed in a plurality of suction passages which diverge from the airbag side of second on-off valves, the second on-off valves being respectively disposed in a plurality of main passages which connect a pressure regulator provided inside a substrate processing apparatus comprising the holding portion to the plurality of airbags; and
the plurality of first passages are connected to the main passages between the second on-off valves and the pressure regulator.

10. The pressure calibration jig according to claim 6, wherein
the flow control portion includes a plurality of check valves respectively disposed in the plurality of first passages and configured to allow a fluid to flow only in a direction from the airbags toward the second passage.

11. A substrate processing apparatus comprising
a polishing table to which a polishing pad used for polishing a substrate is attached;
a holding portion configured to hold and press the substrate against the polishing pad;
a plurality of airbags disposed inside the holding portion; and
a pressure calibration jig used for calibrating pressure applied to the plurality of airbags,
the pressure calibration jig comprising:
a plurality of first passages capable of being communicated with the plurality of airbags, respectively;
a second passage configured to combine and connect the plurality of first passages to a pressure sensor for pressure calibration; and
a flow control portion configured to allow a fluid to flow through the first passage of the plurality of first passages, which first passage corresponds to an airbag selected for pressure calibration, in a direction from the selected airbag toward the second passage, and also configured to prevent the fluid from flowing through the first passages other than the first passage corresponding to the selected airbag in a direction from the second passage toward the airbags.

12. The substrate processing apparatus according to claim 11, wherein
the flow control portion includes a plurality of first on-off valves respectively disposed in the plurality of first passages and configured to open/close the plurality of first passages;
the plurality of first on-off valves are configured to operate in synchronization with second on-off valves, the second on-off valves being respectively disposed in a plurality of main passages which connect a pressure regulator provided inside a substrate processing apparatus comprising the holding portion to the plurality of airbags; and
the plurality of first passages are connected to the main passages between the second on-off valves and the airbags.

13. The substrate processing apparatus according to claim 11, wherein
the flow control portion includes a plurality of first on-off valves respectively disposed in the plurality of first passages and configured to open/close the plurality of first passages;
the plurality of first on-off valves are configured to operate in synchronization with third on-off valves, the third on-off valves being disposed in a plurality of bypass passages which bypass second on-off valves, the second on-off valves being respectively disposed in a plurality of main passages which connect a pressure regulator provided inside a substrate processing apparatus comprising the holding portion to the plurality of airbags; and
the plurality of first passages are connected to the main passages between the second on-off valves and the airbags.

14. The substrate processing apparatus according to claim 11, wherein
the flow control portion includes a plurality of first on-off valves respectively disposed in the plurality of first passages and configured to open/close the plurality of first passages;
the plurality of first on-off valves are configured to operate in synchronization with fourth on-off valves, the fourth on-off valves being respectively disposed in a plurality of suction passages which diverge from the airbag side of second on-off valves, the second on-off valves being respectively disposed in a plurality of main passages which connect a pressure regulator provided inside a substrate processing apparatus comprising the holding portion to the plurality of airbags; and the plurality of first passages are connected to the main passages between the second on-off valves and the pressure regulator.

15. The substrate processing apparatus according to claim 11, wherein the flow control portion includes a plurality of check valves respectively disposed in the plurality of first passages and configured to allow a fluid to flow only in a direction from the airbags toward the second passage.

16. The substrate processing apparatus according to claim 11, wherein the pressure calibration jig further comprises a multi-connector enabling fluid conduction through the plurality of first passages, the pressure calibration jig being connected through the multi-connector to the substrate processing apparatus comprising the holding portion.

17. The substrate processing apparatus according to claim 12, wherein the pressure calibration jig further comprises a multi-connector enabling fluid conduction through the plurality of first passages, the pressure calibration jig being connected through the multi-connector to the substrate processing apparatus comprising the holding portion.

18. The substrate processing apparatus according to claim 13, wherein the pressure calibration jig further comprises a multi-connector enabling fluid conduction through the plurality of first passages, the pressure calibration jig being connected through the multi-connector to the substrate processing apparatus comprising the holding portion.

19. The substrate processing apparatus according to claim 14, wherein the pressure calibration jig further comprises a multi-connector enabling fluid conduction through the plurality of first passages, the pressure calibration jig being connected through the multi-connector to the substrate processing apparatus comprising the holding portion.

20. The substrate processing apparatus according to claim 15, wherein the pressure calibration jig further comprises a multi-connector enabling fluid conduction through the plurality of first passages, the pressure calibration jig being connected through the multi-connector to the substrate processing apparatus comprising the holding portion.

\* \* \* \* \*